US012721186B2

(12) United States Patent
Fürgut et al.

(10) Patent No.: US 12,721,186 B2
(45) Date of Patent: Aug. 25, 2026

(54) SEMICONDUCTOR PACKAGE OR A PRINTED CIRCUIT BOARD, BOTH MODIFIED TO ONE OR MORE OF REDUCE, INVERSE OR UTILIZE MAGNETIC COUPLING CAUSED BY THE LOAD CURRENT OF A SEMICONDUCTOR TRANSISTOR

(71) Applicant: Infineon Technologies Austria AG, Villach (AT)

(72) Inventors: Edward Fürgut, Dasing (DE); Wolfgang Scholz, Olching (DE); Christian Baeumler, Chemnitz (DE); Thomas Basler, Chemnitz (DE); Xing Liu, Chemnitz (DE); Bernd Schmoelzer, Radenthein (AT)

(73) Assignee: Infineon Technologies Austria AG, Villach (AT)

( * ) Notice: Subject to any disclaimer, the term of this patent is extended or adjusted under 35 U.S.C. 154(b) by 420 days.

(21) Appl. No.: 18/217,044

(22) Filed: Jun. 30, 2023

(65) Prior Publication Data

US 2024/0014104 A1 Jan. 11, 2024

(30) Foreign Application Priority Data

Jul. 6, 2022 (EP) .................................... 22183358

(51) Int. Cl.
*H10W 70/40* (2026.01)
*H05K 1/02* (2006.01)
(Continued)

(52) U.S. Cl.
CPC ........ *H10W 70/421* (2026.01); *H05K 1/0216* (2013.01); *H10W 70/458* (2026.01);
(Continued)

(58) Field of Classification Search
CPC .................................................... H01L 23/498
See application file for complete search history.

(56) References Cited

U.S. PATENT DOCUMENTS

2007/0047278 A1 3/2007 Yamamoto et al.
2020/0066620 A1 2/2020 Kanetake et al.
2024/0014104 A1* 1/2024 Fürgut .............. H01L 23/49541

FOREIGN PATENT DOCUMENTS

WO 2015001727 A1 1/2015

* cited by examiner

*Primary Examiner* — Yu-Hsi D Sun
(74) *Attorney, Agent, or Firm* — Murphy, Bilak & Homiller, PLLC

(57) ABSTRACT

A semiconductor package comprises a semiconductor transistor circuit comprising a semiconductor transistor die comprising die terminals, including a collector/drain, a source/emitter, a sense source/sense emitter, a gate, and a load path, a driver line connected with the gate, and a gate control loop in which the a sense source/sense emitter is connected with the driver line, a plurality of external contacts comprising at least one first external contact connected with the drain/collector, at least one second external contact connected with the source/emitter, a third external contact connected with the a sense source/sense emitter, and a fourth external contact connected with the gate, wherein the plurality of external contacts are arranged or configured to reduce or utilize the magnetic coupling induced by a load current flowing through the load path.

8 Claims, 6 Drawing Sheets

(51) Int. Cl.
*H05K 1/18* (2006.01)
*H10W 72/00* (2026.01)
*H10W 72/50* (2026.01)
*H10W 90/00* (2026.01)

(52) U.S. Cl.
CPC ..... *H05K 1/18* (2013.01); *H05K 2201/10166* (2013.01); *H10W 72/07552* (2026.01); *H10W 72/527* (2026.01); *H10W 72/5445* (2026.01); *H10W 90/756* (2026.01)

SEMICONDUCTOR PACKAGE OR A PRINTED CIRCUIT BOARD, BOTH MODIFIED TO ONE OR MORE OF REDUCE, INVERSE OR UTILIZE MAGNETIC COUPLING CAUSED BY THE LOAD CURRENT OF A SEMICONDUCTOR TRANSISTOR

TECHNICAL FIELD

The present disclosure is related to a semiconductor package modified to one or more of reduce, inverse or utilize the magnetic coupling caused by the current flow through the load path of a semiconductor transistor. The present disclosure is also related to a printed circuit board modified for the same purpose.

BACKGROUND

Recent improvements in the power semiconductor technology, in particular the IGBT technology, have reduced the switching losses of the devices considerably. These devices nevertheless need to be further optimized as multiple factors like e.g. parasitic inductances, stray inductances, thermal resistance, affect the overall system efficiency. This is especially important for devices made of semiconductor materials with large bandgaps, such as SiC or GaN transistors, since these are known to be able to switch very quickly and the effects mentioned for switching losses increase in importance with an increase in switching speed. With the so-called Kelvin emitter configuration, the switching losses could be reduced and the switching speed further increased. This package contains an extra emitter pin to be connected exclusively to the gate control loop.

However, it has been found that the magnetic fields generated by the electric currents flowing in the device impair the switching efficiency of the device. In particular, the magnetic fields generated by the source load path are coupled into the logic path consisting of gate and Kelvin emitter and induce a voltage/current which leads to higher switching losses.

For these and other reasons there is a need for the present disclosure.

SUMMARY

A first aspect of the present disclosure is related to a semiconductor package comprising a semiconductor transistor circuit comprising a semiconductor transistor die comprising die terminals, including a collector/drain, a source/emitter, a sense source/sense emitter, a gate, and a load path, a driver line connected with the gate, and a gate control loop in which the sense source/sense emitter is connected with the driver line, a plurality of external contacts comprising at least one first external contact connected with the drain/collector, at least one second external contact connected with the source/emitter, a third external contact connected with the sense source/sense emitter, and a fourth external contact connected with the gate, wherein the plurality of external contacts are arranged or configured to reduce or utilize the magnetic coupling induced by the current flowing through the load path.

A second aspect of the present disclosure is related to a semiconductor package comprising a semiconductor transistor circuit comprising a semiconductor transistor die comprising die terminals, including a collector/drain, a source/emitter, a sense source/sense emitter, a gate, and a load path, a driver line connected with the gate, and a gate control loop in which the sense source/sense emitter is connected with the driver line, a plurality of external contacts comprising a first external contact connected with the drain/collector, a second external contact connected with the source/emitter, a third external contact connected with the sense source/sense emitter, and a fourth external contact connected with the gate, a plurality of electrical connectors connected between the die terminals and the external contacts, wherein a first electrical connector is connected between a source/emitter pad and the second external lead, a second electrical connector is connected between a source sense pad and the fourth external lead, and a third electrical connector is connected between a gate pad and the third external lead, and wherein the plurality of electrical connectors are arranged or configured to reduce or minimize the magnetic coupling induced by the current flowing through the load path.

A third aspect of the present disclosure is related to a printed circuit board comprising an electrical circuitry arranged and configured to reduce or inverse the magnetic coupling induced by a load current flowing through a load path of a semiconductor transistor die of a semiconductor transistor device which is to be connected with the printed circuit path, a first connector which is to be connected with the drain/collector pin of the semiconductor transistor device, a second connector which is to be connected with the source/emitter pin of the semiconductor transistor device, a third connector which is to be connected with the sense source/sense emitter pin of the semiconductor transistor device, and a fourth connector which is to be connected with the gate pin of the semiconductor transistor device, and a gate driver unit comprising a first terminal and a second terminal, wherein the first connector is connected with a first electrical wire, the third connector is connected by a second electrical wire with the first terminal of the gate driver unit, the fourth connector is connected by a third electrical wire with the second terminal of the gate driver unit, the gate driver unit, the second and third electrical wires forming a gate loop, and the second connector is connected with a fourth electrical wire which runs on a side of the gate loop facing away from the first electrical wire.

A fourth aspect of the present disclosure is related to a printed circuit board comprising an electrical circuitry arranged and configured to reduce or utilize the magnetic coupling induced by a load current flowing through a load path of a semiconductor transistor die of a semiconductor transistor device which is to be connected with the printed circuit path, a first connector which is to be connected with the drain/collector pin of the semiconductor transistor device, a second connector which is to be connected with the source/emitter pin of the semiconductor transistor device, a third connector which is to be connected with the sense source/sense emitter pin of the semiconductor transistor device, and a fourth connector which is to be connected with the gate pin of the semiconductor transistor device, and a gate driver unit comprising a first terminal and a second terminal, wherein the first connector is connected with a first electrical wire, the third connector is connected by a second electrical wire with the first terminal of the gate driver unit, the fourth connector is connected by a third electrical wire with the second terminal of the gate driver unit, the gate driver unit, the second and third electrical wires forming a gate loop, and the second connector is connected with a fourth electrical wire which branches into a first path and a second path, the first path passing the gate loop on a first side facing the first wire and the second path passing the gate loop on a second side facing away from the first wire, and the first path comprising a diode, and the second path comprising a resistor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

Figure 1A:
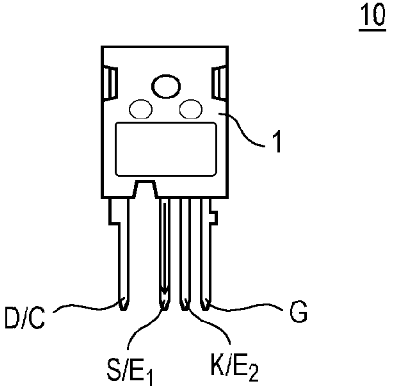
FIG. 1 comprises FIGS. 1A and 1B and shows a top view on an actual standard package in Kelvin configuration (A) and schematic circuit design thereof (B).

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

In general, semiconductor dies as mentioned herein may be manufactured from an elemental semiconductor material (e.g. Si) or from a wide band gap semiconductor material or a compound semiconductor material (e.g. SiC, GaN, SiGe, GaAs). The semiconductor dies may include or may correspond to a power semiconductor component and may thus be referred to as power semiconductor die. Here, the term "power semiconductor die" may refer to a semiconductor die providing at least one of high voltage blocking or high current-carrying capabilities. A power semiconductor die may be configured for high currents having a maximum current value of a few Amperes, such as e.g. 10 A, or a maximum current value of up to or exceeding 1000 A. Similarly, voltages associated with such current values may have values of a few Volts to a few tens or hundreds or even thousands of Volts.

Figure 1B:
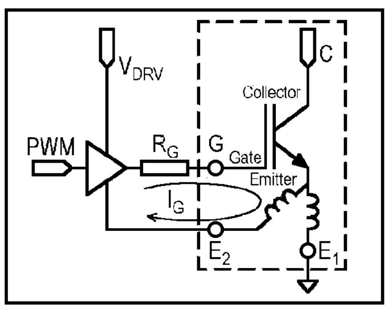

FIG. 1 comprises FIGS. 1A and 1B and shows a top view on an actual prior art standard package of the Applicant (TO 247-4) in a Kelvin configuration (A) and a schematic circuit design thereof (B).

More specifically, FIG. 1A shows a semiconductor package 10 which comprises a package body 1 and 4 external leads, namely from left to right a drain/collector lead D/C, a source/emitter lead $E_1$, a Kelvin or source sense lead $K/E_2$, and gate lead G. The dashed outline in FIG. 1B indicates the elements of the circuit belonging to the package 10, namely the drain/collector D/C, the source/emitter $S/E_1$, the Kelvin emitter or Kelvin source or auxiliary emitter $K/E_2$, and the gate G. The package therefore has—in contrast to earlier packages, which had only 3 leads—a fourth lead $K/E_2$, which is an extra connection between the IGBT's emitter and the gate driver line, known as Kelvin emitter, the associated contact pad on the semiconductor die known as the source sense pad, the connection between the emitter and the gate forming a gate current $I_G$. In some of the following Figures the Kelvin lead will also be denoted as "SS" (source sense). The devices outside the dashed line in FIG. 1B form a gate driver circuit.

Figures 2A, 2B, 2C:
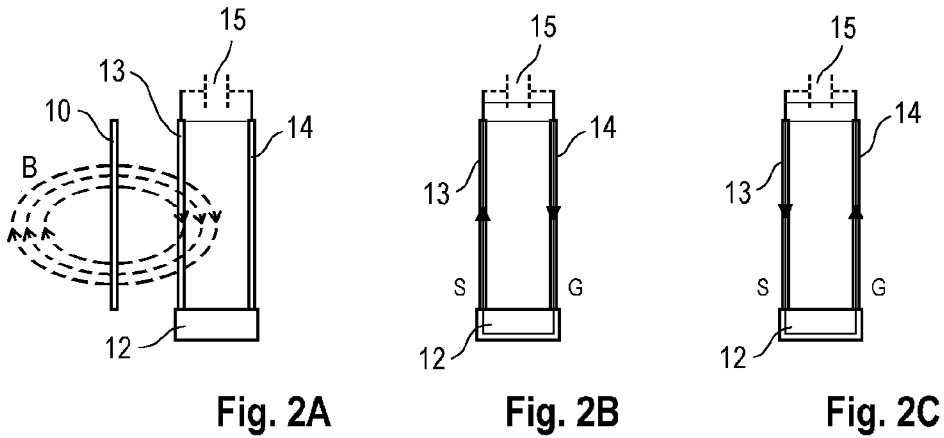
FIG. 2 comprises FIG. 2A to FIG. 2C and illustrates schematically the influence of the magnetic field on the area S between the gate and the Kelvin source (A), decreasing gate source current (B), and increasing gate source current (C).

FIG. 2 comprises FIG. 2A to FIG. 2C and illustrates schematically the influence of the magnetic field generated from load source on the area between the gate and the source (A), increasing gate source current (B), and decreasing gate source current (C).

More specifically, FIG. 2A shows a source load path 11 through which an electric load current is flowing, a magnetic field B generated by the load current (indicated by dashed circles), a gate driver unit 12, a sense source path 13 and a gate path 14 connected to the gate driver unit 12. Shaded in grey is an area between the sense source path 13 and the gate path 14 into which the magnetic field B penetrates. The sense source path 13 and the gate path 14 connect to a capacitor 15 at their respective ends. The capacitor 15 is a gate-source chip capacitance and not a dedicated capacitance.

In FIG. 2A the illustrated magnetic field around the load source is when a constant current flows through the load.

In FIGS. 2B and 2C, switching operations of the device are indicated by arrows drawn into the gate loop. The arrows indicate the first derivative of the gate-source current $I_G$ with respect to time t. Accordingly, FIG. 2B shows the situation with negative $dI_G/dt$ and FIG. 2C shows the situation with positive $dI_G/dt$.

FIG. 2B happened when there is a load current change in the load source, e.g. during the turn-ON of the MOSFETs. There will be a positive dI/dt of the load current in the load source. Due to this positive dI/dt, the magnetic field around the load source becomes stronger. Therefore, there will be magnetic flux modification in the gate control loop. The modified magnetic flux in a closed loop will generate a voltage/current (gate current $I_G$) in the gate loop. Hence, the switching behaviour of the MOSFET will be influenced. FIG. 2B illustrates the situation: during the turn-ON of the MOSFET, the generated gate current will decrease the switching speed (negative coupling).

FIG. 2C illustrates that the magnetic flux in this closed loop decreases. This could happen e.g. during the turn-OFF of a MOSFET and the generated current will again slow down the turn-OFF speed (negative coupling).

Figure 3:
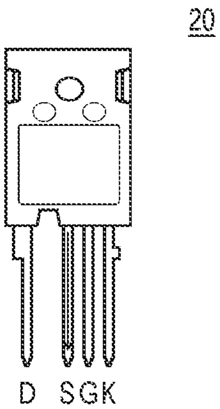
FIG. 3 shows a top view on a package according to the disclosure with a changed lead pinout.

FIG. 3 shows a top view on a package according to the disclosure with a changed lead pinout.

More specifically, FIG. 3 shows a semiconductor package 20 with a changed order of the leads. While the order of the standard package 10 as shown in FIG. 1 was (from left to right) D-S-K-G, it is now D-S-G-K in the modified semiconductor package 20. The changing of the pin arrangement leads to a reversal of the coupling. After modifying the pin arrangement from the package 10 of FIG. 1A to the package 20 of FIG. 3, the magnetic coupling effect can be utilized to accelerate the switching speed.

Figure 4:
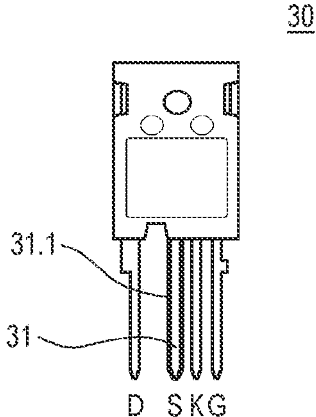
FIG. 4 shows a top view on a package according to the disclosure with the source pin including a magnetic shielding.

FIG. 4 shows a top view on a package according to the disclosure with the source pin including a magnetic shielding.

More specifically, FIG. 4 shows a semiconductor package 30 comprising a source lead 31 (S) having thereon a layer 31.1 of a magnetic shielding material. The layer 31.1 is applied on an outer surface of the source lead 31 and ensures that the magnetic coupling is reduced. The magnetic shielding may comprise a ferrite material.

As shown the leads D, S, K, and G of the semiconductor package 30 of FIG. 4 may have the same order as in the standard package 10 of FIG. 1. This has the advantage that no changes have to be made to the configuration of the PCB. However, it is of course possible to change the order of the leads in the semiconductor package 30 of FIG. 4 in the same way as was done in the semiconductor package 30 of FIG. 3.

Figure 5:
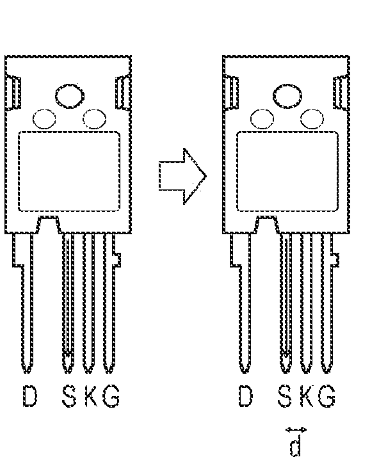
FIG. 5 shows a top view on a package according to the disclosure with an increased distance between the source pin and the source sense pin.

FIG. 5 shows a top view on a package according to the disclosure with an increased distance between the source pin and the source sense pin.

More specifically, the left part of FIG. 5 shows a standard semiconductor package 10 as was shown in FIG. 1 and the right part of FIG. 5 shows a semiconductor package 40 according to the disclosure. As can be seen, a distanced between the two leads S and K is increased thereby reducing the magnetic coupling. This embodiment can also be combined with the embodiment of FIG. 4, namely by additionally applying a magnetic shielding material onto the source lead S.

Figure 6:
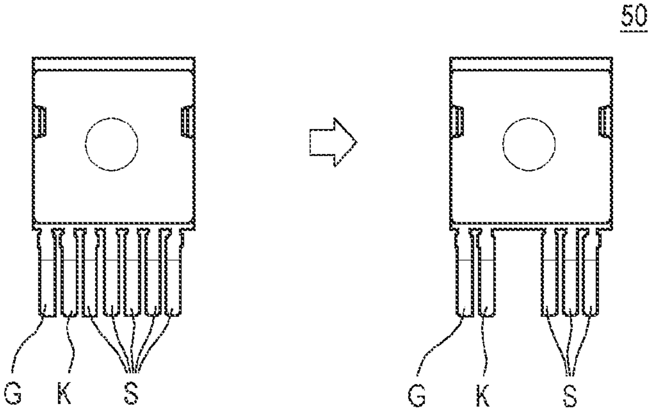
FIG. 6 shows a top view on a standard package (left) and a package according to the disclosure with some leads removed (right).

FIG. 6 shows a top view on a standard package (left) and a package according to the disclosure with some leads removed (right).

More specifically, the left part of FIG. 6 shows another standard semiconductor package of the Applicant (TO263). In this package, the leftmost conductor is the gate lead (G), the lead immediately to its right is the Kelvin lead (K), and all five other leads to its right are source leads. The right part of FIG. 6 shows a semiconductor package 50 according to the disclosure. As can be seen, some source leads of the standard semiconductor package have been removed so that the distance between the leftmost source lead and the kelvin lead has been increased and thus the magnetic coupling between the S-leads and the K-lead is reduced. It is also possible to remove one or two further source leads. Another possibility is to leave all source leads in but not electrically connecting them internally to the source pad of the semiconductor transistor. A combination of these two measures is also conceivable, i.e. removing one or more source leads and not connecting one or more other source lead. The same as with the standard package TO263 can be done with other standard packages like TO252.

FIG. 7 comprises FIG. 7A to 7D and shows a top view on the interior of a package according to the disclosure with changed wire bond configurations.

More specifically, FIG. 7 shows embodiments in which the reduction of the magnetic coupling is not carried out at the level of the external leads but at the level of the wiring within the semiconductor package, so in most cases of FIG. 7 the external pins can be left to the standard package of FIG. 1. In all these embodiments a first bond wire (or bond wires) is connected between a source/emitter pad and the second external lead, a second bond wire is connected between a source sense pad and the forth external lead, and a third bond wire is connected between a gate pad and the third external lead. The notation "power D/S" means either "power S", i.e. a source pin, or "power D", i.e. a drain pin. The latter case would mean a source down configuration.

Figure 7A:
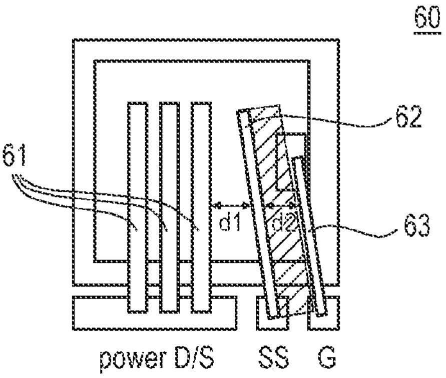
FIG. 7 comprises FIG. 7A to 1D and shows a top view on the interior of a package according to the disclosure with changed wire bond configurations.

FIG. 7A shows an embodiment of a semiconductor package 60 in which the arrangement of the first, second and third bond wires is amended by increasing the lateral distance between the first and second bond wires 61 and 62, and reducing the lateral distance between the second and third bond wires 62 and 63. In particular, increasing the distance between the first and second bond wires 61 and 62 reduces the magnetic coupling between them.

Figure 7B:
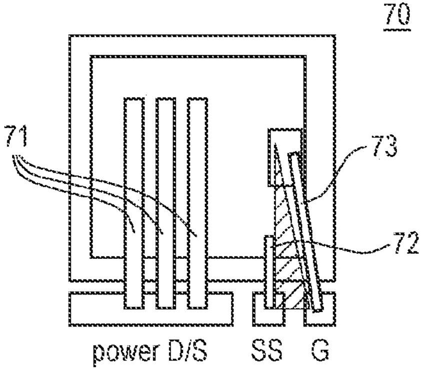

FIG. 7B shows an embodiment of a semiconductor package 70 in which the arrangement of the first, second and third bond wires 71, 72 and 73 is amended by reducing the area between the second and third bond wires 72 and 73 and providing a very short third bond wire 73 between the source sense pad and the source sense lead SS and in this way reducing the magnetic coupling.

Comparing FIGS. 7A and 7B, not only the increase in the distance d1 is achieved, but also a decrease in the coupling from load to control path. When the closed area of the gate-level control loops (see the hatched areas) is reduced, the coupling is also reduced, so the distance d2 can be reduced (see FIG. 7B).

Figure 7C:
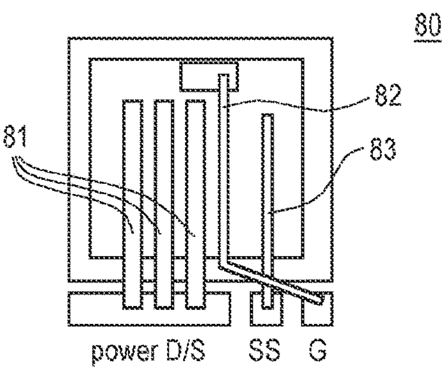

FIG. 7C shows an embodiment of a semiconductor package 80 in which the arrangement of the first, second and third bond wires 81, 82 and 83 is amended by crossing the second and third bond wires 82 and 83 and in this way changing the coupling with a positive feedback.

Figure 7D:
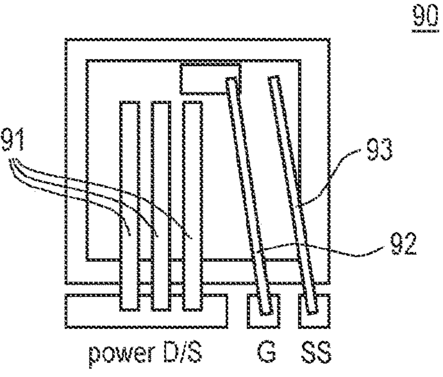

FIG. 7D shows an embodiment of a semiconductor package 90 in which the arrangement of the first, second and third bond wires 91, 92 and 93 is amended by exchanging the gate and source sense leads G and SS also in this way changing the coupling with a positive feedback.

The packages 60, 10, 80, and 90 can be configured as through-hole devices or surface mount devices (SMD) including leadless or leaded devices like, for example, devices comprising gull-wing leads.

Figure 8A:
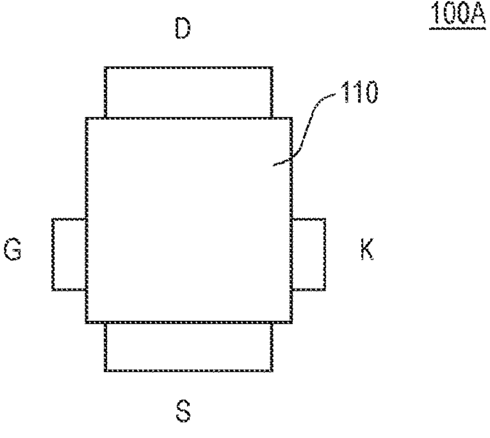
FIG. 8 comprises FIGS. 8A and 8B and shows a top view on a package according to the disclosure with perpendicular logic contacts (A) and a top view of a variant with changed pin arrangement (B).
Figure 8B:
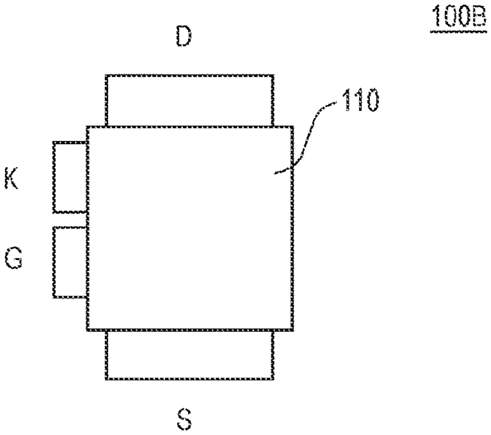

FIG. 8 comprises FIGS. 8A and 8B and shows a top view on a package according to the disclosure with perpendicular logic contacts (A) and a top view of a variant with changed pin arrangement (B).

More specifically, FIG. 8A shows a semiconductor package 100A with a changed arrangement of the leads. The semiconductor package 100A comprises a package body 110. The first and second leads S and D are arranged on two first opposite sides of the package body 110 and the third and fourth leads G and SS are arranged on two second sides of the package body 110. Connecting lines between the first and second leads S and D and between the third and fourth leads G and SS are perpendicular to each other. In this way due to the perpendicular arrangement the magnetic coupling can be reduced.

FIG. 8B shows a variant of a semiconductor package 100B in which the Kelvin pin K is arranged near the gate pin G on one and the same side of the semiconductor package 100B. This variant could be chosen in order to simplify the routing of the control loop on the PCB.

Figure 9:
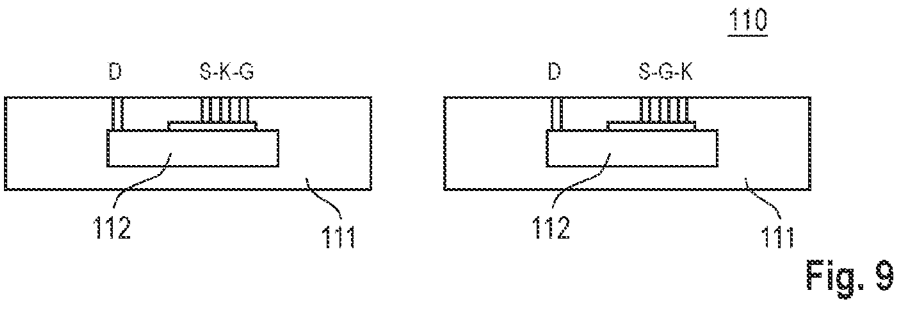
FIG. 9 shows a cross-sectional side view on a standard chip embedded package (left) and a chip embedded package according to the disclosure with changed interconnects (right).

FIG. 9 shows a cross-sectional side view on a standard chip embedded package (left) and a chip embedded package according to the disclosure with changed interconnects (right).

More specifically, the left part of FIG. 9 shows a known semiconductor package which is configured as a die or chip embedded device. Such a device comprises a die carrier 111 comprising an opening and a semiconductor die 112 disposed in the opening and external contacts of the semiconductor die 112 which are configured as interconnects D (drain), S (source), K (kelvin) and G (gate) connected with respective die pads on the semiconductor die 112. These interconnects are typically fabricated by chemical galvanic plating. The die carrier 111 may comprise, for example, a printed circuit board (PCB).

The right part of FIG. 9 shows a semiconductor package 110 according to the disclosure. As can be seen, the interconnects G and K and the respective die pads of the semiconductor die 112 have been spatially interchanged. The changing of the interconnect arrangement leads to a reversal of the coupling. After modifying the interconnect arrangement from the left-side package of FIG. 9 to the package 110, the magnetic coupling effect can be utilized to accelerated the switching speed.

It should be added that the term "die carrier" is to be understood in an all-encompassing sense. It can mean a part of a leadframe disposed in the opening of the core layer. It can also mean a part of a polymer layer, in particular prepreg layer, on which the semiconductor die is disposed.

Figure 10:
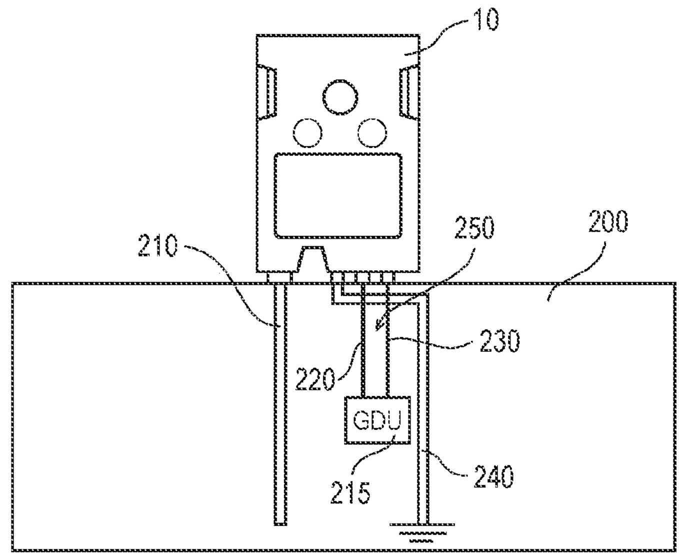
FIG. 10 shows a top view on an example of a printed circuit board according to the third aspect with a standard 4-pin TO-247 discrete housing.

FIG. 10 shows a top view on an example of a printed circuit board according to the third aspect.

The printed circuit board 200 of FIG. 10 comprises an electrical circuitry arranged and configured to reverse the magnetic coupling induced by a load current flowing through a load path of a semiconductor transistor die of a semiconductor transistor device 10 which is to be connected with the printed circuit board 200. The semiconductor transistor device 10 may comprise the conventional semiconductor device package 10 such as shown and described in connection with FIG. 1A. It is also possible, as shown in FIG. 10, to use as the semiconductor device 10 the semiconductor package 10 of FIG. 1A and cut the pins of the package 10 to short ends before connecting to the PCB 200.

The printed circuit board 200 of FIG. 10 further comprises a first connector which is to be connected with the drain/collector pin D/C of the semiconductor transistor device 10, a second connector which is to be connected with the source/emitter pin S/E1 of the semiconductor transistor device 10, a third connector which is to be connected with the Kelvin pin of the semiconductor transistor device 10, and a fourth connector which is to be connected with the gate pin of the semiconductor transistor device 10, and a gate driver unit 215 comprising a first terminal and a second terminal.

The first connector is connected with a first electrical wire 210, the third connector is connected by a second electrical wire 220 with the first terminal of the gate driver unit 215, the fourth connector is connected by a third electrical wire 230 with the second terminal of the gate driver unit 215, wherein the gate driver unit 215, and the second and third electrical wires 220 and 230 form a gate loop 250, and the second connector is connected with a fourth electrical wire 240 which extends on a side of the gate loop 250 facing away from the first electrical wire 210.

An effect of the wiring on the PCB 200 is that it reverses the original negative coupling as present in the package 10 and instead provides a constant positive coupling.

The first to fourth connectors can be comprised of conventional electrical sockets into which the pins of the semiconductor transistor device are to be inserted.

Figure 11:
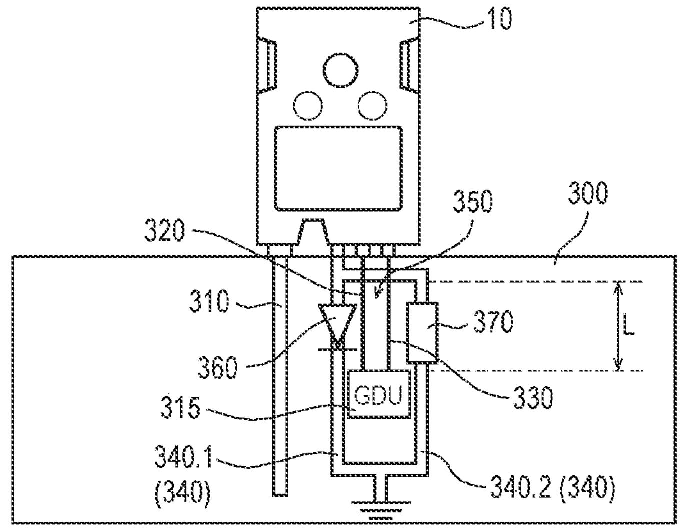
FIG. 11 shows a top view on an example of a printed circuit board according to the fourth aspect with a standard 4-pin TO-247 discrete housing.

FIG. 11 shows a top view on an example of a printed circuit board according to the fourth aspect.

The printed circuit board 300 of FIG. 11 comprises an electrical circuitry arranged and configured to reduce or utilize the magnetic coupling induced by a load current flowing through a load path of a semiconductor transistor die of a semiconductor transistor device 10 which is to be connected with the printed circuit board 300. The semiconductor transistor device 10 may comprise the conventional semiconductor device package 10 such as shown and described in connection with FIG. 1A. It is also possible, as shown in FIG. 10, to use as the semiconductor device 10 the semiconductor package 10 of FIG. 1A and cut the pins of the package 10 to short ends before connecting to the PCB 300.

The printed circuit board 300 of FIG. 11 further comprises a first connector which is to be connected with the drain/collector pin D/C of the semiconductor transistor device 10, a second connector which is to be connected with the source/emitter pin S/E1 of the semiconductor transistor device 10, a third connector which is to be connected with the Kelvin pin of the semiconductor transistor device 10, and a fourth connector which is to be connected with the gate pin of the semiconductor transistor device 10, and a gate driver unit 315 comprising a first terminal and a second terminal.

The first connector is connected with a first electrical wire 310, the third connector is connected by a second electrical wire 320 with the first terminal of the gate driver unit 315, the fourth connector is connected by a third electrical wire 330 with the second terminal of the gate driver unit 315, wherein the gate driver unit 315 and the second and third electrical wires 320 and 330 form a gate loop 350. The second connector is connected with a fourth electrical wire 340 which branches into a first path 340.1 and a second path 340.2, the first path 340.1 passing the gate loop 350 on a first side facing the first wire 310 and the second path 340.2 passing the gate loop 350 on a second side facing away from the first wire 310, and the first path 340.1 comprising a diode 360 in the forward direction, and the second path 340.2 comprising a resistor 370. The diode 360 can, for example, be a low voltage Schottky diode 360 in forward direction.

The first to fourth connectors can be comprised of conventional electrical sockets into which the pins of the semiconductor transistor device are to be inserted.

In operation a semiconductor transistor device 10 will be connected to the PCB 300. The semiconductor transistor device 10 can be a conventional TO 247-4 package device like a SiC-MOSFET or a Si-IGBT device. The semiconductor transistor device 10 comprising drain/collector (D/C), source (S/E1), Kelvin (K/E2), and gate (G) pins will be connected to the first to fourth connectors of the PCB 300 as shown in FIG. 11, wherein the gate and Kelvin pins will be connected with the third and fourth connectors of the PCB 300. On the PCB 300 the third and fourth connectors are connected with the gate driver unit 315 thus forming the gate loop 350. The gate loop 350 defines a coupling area between the second and third electrical wires 320 and 330. The size of the coupling area can be adjusted by the distance L between an upper horizontal section of the fourth electrical wire 340 and the upper edge of the gate driver unit 315.

The load current branches into path 340.1 or path 340.2 after the source connector. The diode 360 and the resistor 370 form a current shifter wherein for low load current, the current flows via resistor 370, i.e. via path 340.2, while at high load current the diode 360 is switched through and the current flows increasingly via diode 360, i.e. via path 340.1. Since load current path 340.1 is disposed on the right hand side of the coupling area 350, it leads to a positive coupling, whereas load current path 2 is disposed on the right hand side of the coupling area and thus leads to a negative coupling. Negative coupling is activated for failure case, e.g. short circuit.

It should be added that the PCBs 200 and 300 according to the third and fourth aspects are not restricted to the specific packaging shown and described in connection with FIGS. 10 and 11. It is e.g. also possible to apply the circuitry on another packaging in which case the wire routing on PCB needs to me matched on the applied packaging.

Figure 12A:
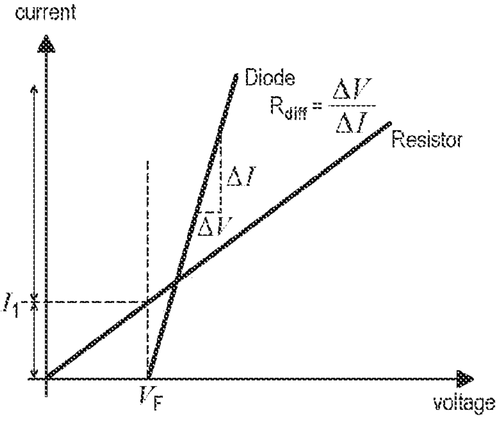
FIG. 12 comprises FIGS. 12A and 12B and shows a current-voltage diagram illustrating the characteristics of the diode and the resistor of the electrical circuitry as shown in FIG. 11 (A) and a current-voltage diagram illustrating the characteristic of the semiconductor transistor (B).
Figure 12B:
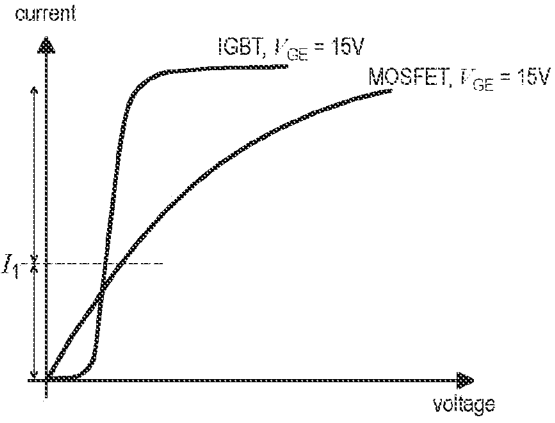

FIG. 12 comprises FIGS. 12A and 12B and shows a current-voltage diagram illustrating the characteristics of the diode and the resistor of the electrical circuitry as shown in FIG. 11 (A) and a current-voltage diagram illustrating the characteristics of the semiconductor transistors IGBT and MOSFET (B).

The selection of the resistor and the diode depends on the current level in the application mode. To achieve the best coupling effect, the maximal current amplitude in the application mode should be smaller than $I_1$ in FIG. 12A. A higher VF of the diode or a lower resistor value can extend the amplitude of $I_1$. In over current or failure case, more current should flow through the diode (path 2) to trigger the negative coupling. A steep increase in the diode characteristic hence a low differential resistor $R_{diff}$ of the diode is desirable.

FIG. 12B illustrates the current-voltage characteristics of the semiconductor transistors IGBT and MOSFET. Shown also at the current axis is the position of $I_1$ which is the maximal current in normal operation.

Examples

In the following specific examples of the present disclosure are described.

Example 1 is a semiconductor package, comprising a semiconductor transistor circuit comprising a semiconductor transistor die comprising die terminals, including a collector/drain, a source/emitter, a sense source/sense emitter, a gate, and a load path, a driver line connected with the gate; and a gate control loop in which the emitter/source is connected with the driver line, a plurality of external contacts comprising a first external contact (D/C) connected with the drain/collector, at least one second external contact (S/E1) connected with the source/emitter, a third external contact (K/E2) connected with the sense source/sense emitter, and a fourth external contact (G) connected with the gate; wherein the plurality of external contacts are arranged or configured to reduce or utilize the magnetic coupling induced by a load current flowing through the load path.

Example 2 is the semiconductor package according to Example 1, wherein the semiconductor package is configured as a through-hole device in which the external contacts are configured as external leads.

Example 3 is the semiconductor package according to Example 2, further comprising one or more of:

- the third external contact (K/E2) and the fourth external contact (G) are exchanged;
- a distance between the second external contact (S/E1) and the third external contact (K/E2) is increased;
- some second external contacts (S/E1) of a plurality of second contacts (S/E1) are removed or not electrically connected internally; or the second external contact (S/E1, 31) is provided with a magnetic shielding (31.1).

Example 4 is the semiconductor package according to Example 3, wherein the magnetic shielding comprises a ferrite material.

Example 5 is the semiconductor package according to any one of the preceding Examples, wherein in a redesign of a standard package, the arrangement of the external contacts is changed in such a way that a distance d between the second external contact (S/E1) and the third external contact (K/E2) is increased.

Example 6 is the semiconductor package according to any one of the preceding Examples, wherein in a redesign of a standard package, the arrangement of the external contacts is changed in such a way that some second contacts (S/E1) of a plurality of second contacts (S/E1) are removed and/or not electrically connected internally.

Example 7 is a semiconductor package, comprising a semiconductor transistor circuit comprising a semiconductor transistor die comprising die terminals, including a collector/drain, a source/emitter, a sense source/sense emitter, a gate, and a load path, a driver line connected with the gate, and a gate control loop in which the sense source/sense emitter is connected with the driver line;

a plurality of external contacts comprising a first external contact (D/C) connected with the drain/collector, at least one second external contact (S/E1) connected with the source/emitter, a third external contact (K/E2) connected with the a sense source/sense emitter, and a fourth external contact (G) connected with the gate;

a plurality of electrical connectors connected between the die terminals and the external contacts, wherein a first electrical connector is connected between a source/emitter pad and the second external lead, a second electrical connector is connected between a source sense pad and the fourth external lead, and a third electrical connector is connected between a gate pad and the third external lead, and wherein the plurality of electrical connectors are arranged or configured to reduce or minimize the magnetic coupling induced by the current flowing through the load path.

Example 8 is the semiconductor package according to Example 7, further comprising one or more of:

increasing the lateral distance between the first and second electrical connectors, and reducing the lateral distance between the second and third electrical connectors, reducing the area between the second and third electrical connectors, crossing the second and third electrical connectors, or exchanging the third and fourth external leads (G, SS) and correspondingly rearranging the second and third electrical connectors.

Example 9 is the semiconductor package according to Example 7 or 8, wherein the electrical connectors comprise bond wires or clips.

Example 10 is the semiconductor package according to any one of Examples 7 to 9, wherein the semiconductor package is configured as a surface mount device in which the external contacts are configured as external leads including gull-wing leads.

Example 11 is the semiconductor package according to any one of the preceding Examples, wherein the semiconductor package comprises a package body; and the first and second external contacts (D, S) are arranged on two first opposite sides of the package body and the third and fourth external contacts (G, K) are arranged on two second sides of the package body so that the connecting lines between the first and second leads (D, S) and between the third and fourth leads (G, K) are perpendicular to each other.

Example 12 is the semiconductor package according to Example 1, wherein the semiconductor package is configured as a die or chip embedded device comprising a die carrier comprising an opening;

a semiconductor die disposed in the opening;

wherein the external contacts are configured as interconnects connected with the semiconductor die.

Example 13 is the semiconductor package according to Example 12, wherein the die carrier comprises or is part of a printed circuit board (PCB) or of a prepreg layer.

Example 14 is a printed circuit board, comprising an electrical circuitry arranged and configured to reduce or inverse the magnetic coupling induced by a load current flowing through a load path of a semiconductor transistor die of a semiconductor transistor device which is to be connected with the printed circuit board;

a first connector which is to be connected with the drain/collector pin of the semiconductor transistor device, a second connector which is to be connected with the source/emitter pin of the semiconductor transistor device, a third connector which is to be connected with the Kelvin pin of the semiconductor transistor device, and a fourth connector which is to be connected with the gate pin of the semiconductor transistor device; and a gate driver unit comprising a first terminal and a second terminal, wherein the first connector is connected with a first electrical wire, the third connector is connected by a second electrical wire with the first terminal of the gate driver unit, the fourth connector is connected by a third electrical wire (230) with the second terminal of the gate driver unit, wherein the gate driver unit, the second and third electrical wires form a gate loop, and the second connector is connected with a fourth electrical wire which extends on a side of the gate loop facing away from the first electrical wire.

Example 15 is a printed circuit board, comprising an electrical circuitry arranged and configured to reduce or utilize the magnetic coupling induced by a load current flowing through a load path of a semiconductor transistor die of a semiconductor transistor device which is to be connected with the printed circuit board;

a first connector which is to be connected with the drain/collector pin of the semiconductor transistor device, a second connector which is to be connected with the source/emitter pin of the semiconductor transistor device, a third connector which is to be connected with the Kelvin pin of the semiconductor transistor device, and a fourth connector which is to be connected with the gate pin of the semiconductor transistor device; and a gate driver unit comprising a first terminal and a second terminal, wherein the first connector is connected with a first electrical wire, the third connector is connected by a second electrical wire with the first terminal of the gate driver unit, the fourth connector is connected by a third electrical wire with the second terminal of the gate driver unit, wherein the gate driver unit and the second and third electrical wires form a gate loop, the second connector is connected with a fourth electrical wire which branches into a first path and a second path, the first path passing the gate loop on a first side facing the first wire and the second path passing the gate loop on a second side facing away from the first wire, and the first path comprising a diode in forward direction, and the second path comprising a resistor.

Example 16 is the printed circuit board according to Example 15, wherein the diode comprises a Schottky diode in forward direction.

In addition, while a particular feature or aspect of an embodiment of the disclosure may have been disclosed with respect to only one of several implementations, such feature or aspect may be combined with one or more other features or aspects of the other implementations as may be de-sired and advantageous for any given or particular application. Furthermore, to the extent that the terms "include", "have", "with", or other variants thereof are used in either the detailed description or the claims, such terms are intended to be inclusive in a manner similar to the term "comprise".

Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor package, comprising a semiconductor transistor circuit comprising a semiconductor transistor die comprising die terminals, including a collector/drain, a source/emitter, a sense source/sense emitter, a gate, and a load path;

a driver line connected with the gate; and a gate control loop in which the source/emitter is connected with the driver line;

a plurality of external contacts comprising a first external contact connected with the collector/drain, at least one second external contact connected with the source/emitter, a third external contact connected with the sense source/sense emitter, and a fourth external contact connected with the gate; wherein wherein the semiconductor package comprises one of the following arrangements:

a coupling enhancing arrangement of the external contacts whereby a switching speed of the transistor die is enhanced by a load current flowing through the first and second external contacts that is magnetically coupled with the fourth external contact; or a coupling mitigation arrangement that mitigates a magnetic coupling influence of the second external contact when the load current flows through the first and second external contacts.

2. A semiconductor package according to claim 1, wherein the semiconductor package is configured as a die or chip embedded device comprising;

a die carrier comprising an opening;

a semiconductor die disposed in the opening;

wherein the external contacts are configured as interconnects connected with the semiconductor die.

3. The semiconductor package according to claim 2, wherein the die carrier comprises or is part of a printed circuit board or of a prepreg layer.

4. The semiconductor package according to claim 1, wherein the semiconductor package comprises the coupling enhancing arrangement, and wherein the coupling enhancing arrangement comprises an ordered arrangement of the external contacts whereby that the fourth external contact is closer to the second external contact than the first external contact.

5. The semiconductor package according to claim 1, wherein the semiconductor package comprises the coupling mitigation arrangement.

6. The semiconductor package according to claim 5, wherein the coupling mitigation arrangement comprises a magnetic shielding on the second external contact.

7. The semiconductor package according to claim 5, wherein the coupling mitigation arrangement comprises a plurality of electrically inactive contacts in between the second external contact and the third and fourth external contacts.

8. The semiconductor package according to claim 1, wherein the semiconductor package comprises the coupling enhancing arrangement and the coupling mitigation arrangement.

* * * * *